United States Patent [19]
Norman

[11] Patent Number: 5,963,473
[45] Date of Patent: *Oct. 5, 1999

[54] FLASH MEMORY SYSTEM AND METHOD FOR MONITORING THE DISTURB EFFECT ON MEMORY CELL BLOCKS DUE TO HIGH VOLTAGE CONDITIONS OF OTHER MEMORY CELL BLOCKS

[75] Inventor: Robert Norman, San Jose, Calif.

[73] Assignee: Micron Technology, Inc., Boise, Id.

[ * ] Notice: This patent is subject to a terminal disclaimer.

[21] Appl. No.: 08/989,523

[22] Filed: Dec. 12, 1997

Related U.S. Application Data

[63] Continuation of application No. 08/652,779, May 23, 1996, Pat. No. 5,715,193.
[51] Int. Cl.$^6$ .................................................. G11C 11/34
[52] U.S. Cl. ........................... 365/185.02; 365/185.11; 365/185.29; 365/185.33
[58] Field of Search ..................... 365/185.02, 185.11, 365/185.29, 185.33, 185.09

[56] References Cited

U.S. PATENT DOCUMENTS

| | | | |
|---|---|---|---|
| 5,239,505 | 8/1993 | Fazio et al. ........................ | 365/185.02 |
| 5,280,447 | 1/1994 | Hazen et al. ....................... | 365/185.02 |
| 5,369,615 | 11/1994 | Harari et al. ............................ | 365/218 |
| 5,396,468 | 3/1995 | Harari et al. ............................ | 365/218 |
| 5,465,236 | 11/1995 | Naruke ................................ | 365/185.11 |
| 5,504,760 | 4/1996 | Harari et al. ........................... | 371/40.1 |
| 5,568,439 | 10/1996 | Harari ............................. | 365/185.29 X |
| 5,615,148 | 3/1997 | Yamamura et al. ............... | 365/185.11 |
| 5,619,451 | 4/1997 | Costabello et al. ............. | 365/185.33 X |
| 5,648,929 | 7/1997 | Miyamoto ........................... | 365/185.04 |

*Primary Examiner*—Huan Hoang
*Attorney, Agent, or Firm*—Schwegman, Lundberg, Woessner & Kluth, P.A.

[57] ABSTRACT

A memory circuit including at least one array of flash memory cells organized into one or more physically separate decode blocks and a controller which monitors the disturb effect on each independently erasable "erase" block of cells of each decode block due to erasures of other erase blocks in the same decode block, and a method of operating such a circuit. Preferably, the controller controls memory operations of each array in addition to monitoring the disturb effect on each erase block. The disturb effect causes cells of an erase block to lose charge from their floating gates each time an erase operation is performed on another erase block in the same decode block. Preferably, each time an erase block is erased, the controller updates a table for the decode block which contains the erased block by adding a unit of disturb to the count for each other erase block in the decode block and resetting the count for the erased block to zero. Also preferably, the controller performs a refresh operation on each erase block whose disturb count reaches a predetermined maximum value. During the refresh operation, any necessary recovery procedures are performed to restore the proper charge to the floating gate of each cell of the erase block, thus preventing any erroneous reads of data that would otherwise occur (due to the disturb effect) absent performance of the refresh operation.

25 Claims, 8 Drawing Sheets

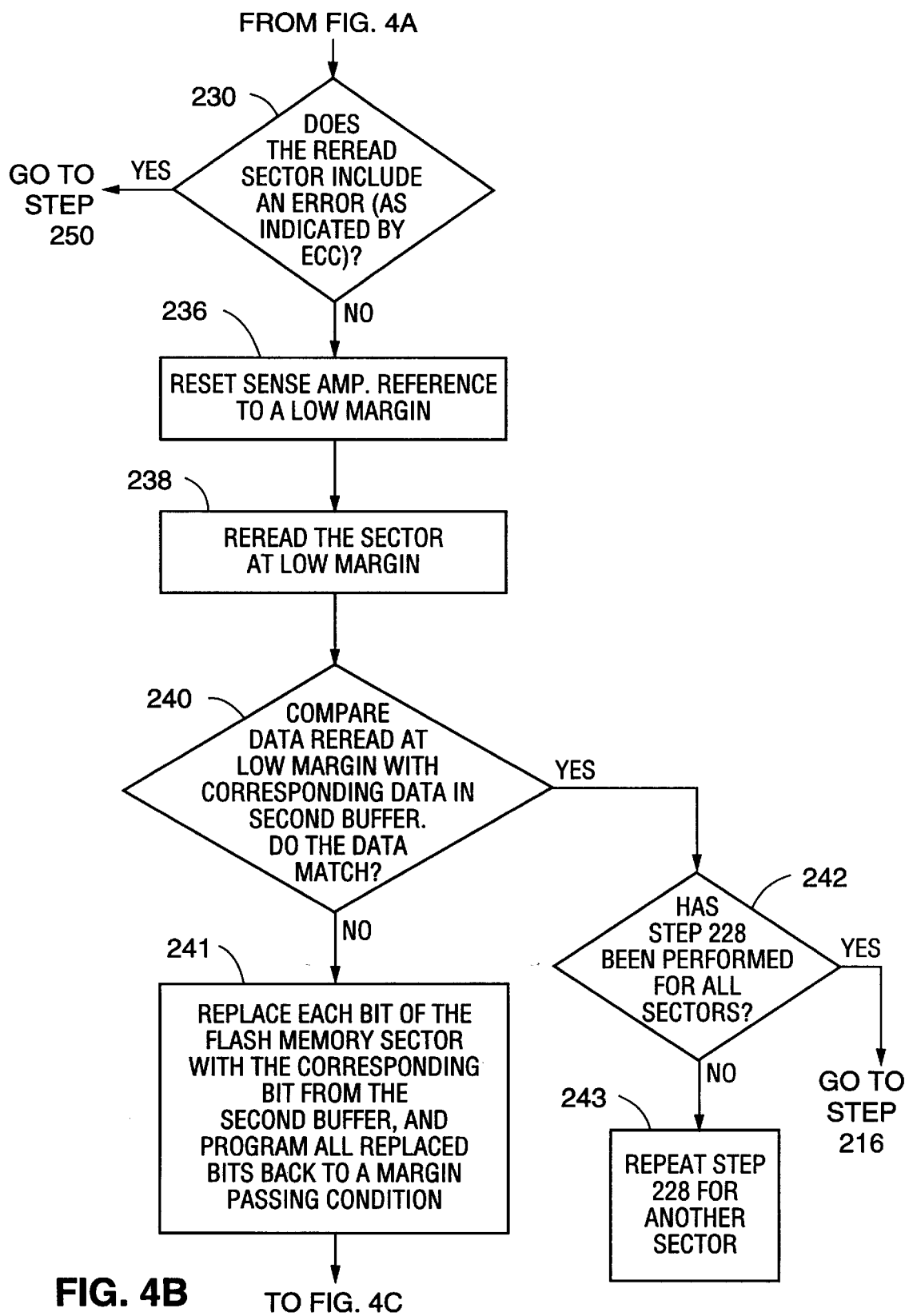

5,963,473

FLASH MEMORY SYSTEM AND METHOD FOR MONITORING THE DISTURB EFFECT ON MEMORY CELL BLOCKS DUE TO HIGH VOLTAGE CONDITIONS OF OTHER MEMORY CELL BLOCKS

This is a Continuation of application Ser. No. 08/652,779, filed May 23, 1996, now U.S. Pat. No. 5,715,193.

BACKGROUND OF THE INVENTION

1. Field of the Invention

The invention pertains to a memory circuit including at least one array of flash memory cells organized into independently erasable blocks and a controller, and especially to a memory circuit of this type which is designed to emulate a magnetic disk drive. The invention is a method and apparatus for monitoring the disturb effect on each independently erasable block of memory cells of a memory cell array in such a memory circuit, where the disturb effect causes cells of each such block to lose charge from their floating gates in response to performance of operations (e.g., erase and programming operations) in which high voltage is applied to other blocks of the cell array.

2. Description of Related Art

It is conventional to implement a memory circuit as an integrated circuit including an array of flash memory cells and circuitry for independently erasing selected blocks of the cells. FIG. 1 is a simplified block diagram of such an integrated circuit (flash memory chip 103). Each time one such block is erased (or programmed), the so-called "disturb" effect causes cells of others of the blocks to lose charge from their floating gates (this disturb effect will be described in greater detail below). An integrated flash memory chip such as memory chip 103 of FIG. 1 (or a memory system including such a memory chip) can be modified in accordance with the present invention to account for the disturb effect on each of its independently erasable blocks of memory cells, and optionally also to reduce or eliminate errors in reading or writing data which would otherwise result from the disturb effect.

Memory chip 103 of FIG. 1 includes flash memory array circuit 16 (comprising rows and columns of nonvolatile flash memory cells), I/O pins DQ0–DQ15 (for asserting output data to an external device or receiving input data from an external device), input buffer circuits 122, 122A, and 122B, output buffer circuits 128, 128A, and 128B, address buffer 17 for receiving address bits A0 through A17 from an external device, row decoder circuit (X address decoder) 12, column multiplexer circuit (Y multiplexer) 14, and control unit 29 (also denoted herein as "controller" 29).

Each of the cells (storage locations) of memory array circuit 16 is indexed by a row index (an "X" index determined by decoder circuit 12) and a column index (a "Y" index determined by Y decoder circuit 13 of circuit 14). Each column of cells of memory array 16 comprises "n" memory cells, each cell implemented by a floating-gate N-channel transistor. The drains of all transistors of a column are connected to a bitline, and the gate of each of the transistors is connected to a different wordline, and the sources of the transistors are held at a source potential (which is usually ground potential for the chip during a read or programming operation). Each memory cell is a nonvolatile memory cell since the transistor of each cell has a floating gate capable of semipermanent charge storage. The current drawn by each cell (i.e., by each of the N-channel transistors) depends on the amount of charge stored on the cell's floating gate. Thus, the charge stored on each floating gate determines a data value that is stored "semipermanently" in the corresponding cell. In cases in which each of the N-channel transistors is a flash memory device, the charge stored on the floating gate of each is erasable (and thus the data value stored by each cell is erasable) by appropriately changing the voltage applied to the gate and source (in a well known manner).

The individual memory cells (not depicted) are addressed by eighteen address bits (A0–A17), with nine bits being used by X decoder circuit 12 to select the row of array 16 in which the target cell is located and the remaining nine bits being used by Y decoder circuit 13 (of Y-multiplexer 14) to select the appropriate column of array 16. In response to a nine-bit subset of address bits A0–A17, Y decoder circuit 13 determines a column address which selects one column of cells of array 16. In response to the other nine address bits A0–A17, X decoder circuit 12 determines a row address which selects one cell in the selected column.

In a normal operating mode, chip 103 executes a write operation as follows. Address buffer 17 asserts appropriate ones of address bits A0–A17 to circuit 14 and decoder circuit 12. In response to these address bits, circuit 14 determines a column address (which selects one of the columns of memory cells of array 16), and circuit 12 determines a row address (which selects one cell in the selected column). In response to a write command supplied from controller 29, a signal (indicative of data) present at the output of input buffer 122, 122A, and/or 122B is asserted through circuit 14 to the cell of array 16 determined by the row and column address (e.g., to the drain of such cell). During such write operation, output buffers 128, 128A, and 128B are disabled.

In the normal operating mode, chip 103 executes a read operation as follows. Address buffer 17 asserts appropriate ones of address bits A0–A17 to circuit 14 and address decoder circuit 12. In response to these address bits, circuit 14 asserts a column address to memory array 16 (which selects one of the columns of memory cells), and circuit 12 asserts a row address to memory array 16 (which selects one cell in the selected column). In response to a read command supplied from control unit 29, a current signal indicative of a data value stored in the cell of array 16 (a "data signal") determined by the row and column address is supplied from the drain of the selected cell through the bitline of the selected cell and then through circuit 14 to sense amplifier circuitry 33. This data signal is processed in amplifier circuitry 33, buffered in output buffers 128, 128A, and/or 128B, and finally asserted at pins DQ0–DQ15. During such read operation, input buffers 122, 122A, and 122B are disabled.

Chip 103 also includes a pad which receives a high voltage $V_{pp}$ from an external device, and a switch 121 connected to this pad. During some steps of a typical erase or program sequence (in which the cells of array 16 are erased or programmed), control unit 29 sends a control signal to switch 121 to cause switch 121 to close and thereby assert the high voltage $V_{pp}$ to various components of the chip including X decoder 12. Voltage $V_{pp}$ is higher (typically $V_{pp}=12$ volts) than the normal operating mode supply voltage (typically $V_{cc}=5$ volts or $V_{cc}=5.5$ volts) for the MOS transistors of chip 103.

When reading a selected cell of array 16, if the cell is in an erased state, the cell will conduct a first current which is converted to a first voltage in sense amplifier circuitry 33. If the cell is in a programmed state, it will conduct a second current which is converted to a second voltage in sense amplifier circuitry 33. Sense amplifier circuitry 33 determines the state of the cell (i.e., whether it is programmed or erased corresponding to a binary value of 0 or 1, respectively) by comparing the voltage indicative of the cell state to a reference voltage. The outcome of this comparison is an output which is either high or low (corresponding to a digital value of one or zero) which sense amplifier circuitry 33 sends to output buffers 128 and 128E (and through multiplexer 124 to output buffer 128A). One or more of the output buffers in turn asserts a corresponding data signal to corresponding ones of pins DQ0–DQ15 (from which it can be accessed by an external device).

It is important during a write operation to provide the wordline of the selected cell with the proper voltage and the drain of the selected cell with the appropriate voltage level (the voltage determined by the output of each input buffer, asserted through latch/multiplexer 130 to circuit 14), in order to successfully write data to the cell without damaging the cell.

Internal state machine 120 of control unit 29 of chip 103 controls detailed operations of chip 103 such as the various individual steps necessary for carrying out programming, reading and erasing operations. State machine 120 thus functions to reduce the overhead required of a processor (not depicted) typically used in association with chip 103.

Memory operations, including programming, reading, and erasing can be initiated in various ways. For all operations, the chip enable signal $\overline{CE}$ must be made active (low). To perform a read operation, write enable signal $\overline{WE}$ must be made inactive (high). For a write operation, signal $\overline{WE}$ must be made active (low). In order to reduce the likelihood of accidental modification of data, erase and program operations require receipt of two consecutive commands that are processed by command execution logic unit 124. The program and erase commands are provided by the associated processor to data I/O pins DQ0–DQ7, forwarded to input buffer 122, and then forwarded to the command execution logic unit 124 for processing.

If memory array 16 is to be erased (typically, all or large blocks of cells are erased at the same time), the processor causes the Output Enable $\overline{OE}$ pin to be inactive (high), and the Chip Enable $\overline{CE}$ and Write Enable $\overline{WE}$ pins to be active (low). The processor then issues an 8 bit command 20H (0010 0000) on data I/O pins DQ0–DQ7, typically called an Erase Setup command (each of I/O pins DQ0–DQ7 corresponds to an I/O pad). This is followed by issuance of a second eight bit command D0H (1101 0000), typically called an Erase Confirm command. Two separate commands are used to reduce the possibility of an inadvertent erase operation.

The commands are transferred to data input buffer 122, and the commands are then transferred to command execution logic unit 124 of control unit 29. Logic unit 124 then instructs state machine 120 to perform all the numerous and well known steps for erasing array 16.

Once an erase sequence is completed, state machine 120 updates an 8 bit status register 126, the contents of which are transferred to data output buffer 128A which is connected to data I/O pins DQ0–DQ7 of the memory system. The processor periodically polls the data I/O pins to read the contents of status register 126 in order to determine whether an erase sequence has been completed and whether it has been completed successfully.

During a typical erase operation, it is desired to erase all the cells of array 16 (or an erase block of the cells) so that the threshold voltages are all within a specified voltage range. That range is typically a small positive voltage range such as from +1.5 to +3.0 volts. If the erased cells fall within this range, the cell to be read (the "selected" or "target") cell will produce a cell current in a read operation. The presence of cell current flow indicates that the cell is in an erased state (logic "1") rather than a programmed state (logic "0"). Cell current is produced in a selected erased cell if the voltage applied to the control gate of the cell, by way of the wordline connected to X decoder 12, exceeds the threshold voltage of the erased cell. In addition, cells which are not being read ("deselected" cells) are prevented from producing a cell current even if such cells have been erased to a low threshold voltage state. By way of example, for cells located in the same row as the selected cell, by definition, share the same wordline as the selected cell. However, the drains of the deselected cells will be floating thereby preventing a cell current from being generated. Deselected cells in the same column will not conduct cell current because the wordlines of such deselected cells are typically grounded. Thus, the gate-source voltage of these cells will be insufficient to turn on these deselected cells even if they are in an erased state.

An example of a flash memory array which can be employed as memory array 16 of chip 103 is described in U.S. patent application Ser. No. 08/606,246, entitled "Segmented Non-Volatile Memory Array with Multiple Sources with Improved Word Line Control Circuitry," filed on Feb. 23, 1996 and assigned to the assignee of the present application (Attorney Docket No. MCRN-F4100), the specification of which is incorporated herein by reference.

The present invention is particularly useful as an improvement to flash memory systems of the type designed to emulate magnetic disk drive systems. This type of flash memory system is typically implemented as a card (for insertion into a computer system) with a chip set mounted thereon, where the chip set includes an onboard controller and several memory chips controlled by the controller. Each memory chip implements an array of flash memory cells organized into independently erasable blocks. A conventional flash memory system of this type can be modified in accordance with the invention to enable it to account for the "disturb" effect on each independently erasable block of flash memory cells.

In the past, magnetic hard disk systems have been the dominant storage media for computers and related systems. The low cost and high capacity offered by this technology has made magnetic hard disk systems the mainstay in the computer industry. Because of the dominance of this technology, virtually all computer systems use and support this technology. The support of magnetic disk systems is evident by the software associated with the disk drives. The dominant computer operating system known as "DOS" (Disk Operating System) is essentially a software package used to manage a disk system. DOS has been developed by IBM Corporation, Microsoft Corporation, and Novell as the heart of widely used computer software. The first generation of Microsoft Corporation's "Windows" operating system software was essentially a continuation of the original DOS software with a user friendly shell added for ease of use.

The DOS software was developed to support the physical characteristics of hard drive structures, supporting file structures based on heads, cylinders and sectors. The DOS software stores and retrieves data based on these physical attributes. Magnetic hard disk drives operate by storing polarities on magnetic material. This material is able to be rewritten quickly and as often as desired. These characteristics has allowed DOS to develop a file structure that stores files at a given location which is updated by a rewrite of that location as information is changed. Essentially all locations in DOS are viewed as fixed and do not change over the life of the disk drive being used therewith, and are easily updated by rewrites of the smallest supported block of this structure. A sector (of a magnetic disk drive) is the smallest unit of storage that the DOS operating system will support. In particular, a sector has come to mean 512 bytes of information for DOS and most other operating systems in existence. DOS also uses clusters as a storage unit. Clusters, however, are nothing more than the logical grouping of sectors to form a more efficient way of storing files and tracking them with less overhead.

The development of flash memory integrated circuits has enabled a new technology to offer competition to magnetic hard drives and offer advantages and capabilities that are hard to support by disk drive characteristics and features. The low power, high ruggedness, and small sizes offered by a solid state flash memory system make such a flash memory system attractive and able to compete with a magnetic hard disk drive system. Although a memory implemented with flash memory technology may be more costly than a hard disk drive system, computers and other processing systems are being developed that require (or benefit greatly from) use of flash memory features.

Thus, flash memory systems have been developed that emulate the storage characteristics of hard disk drives. Such a flash memory system is preferably structured to support storage in 512 byte blocks along with additional storage for overhead associated with mass storage, such as ECC (error correction code) bits and/or redundant bits. A key to this development is to make the flash memory array respond to a host processor in a manner that looks like a disk so the operating system can store and retrieve data in a known manner and be easily integrated into a computer system including the host processor.

To make a flash memory easily integratable into a host computer, two basic approaches have been developed. One approach is to configure the flash memory as a storage array, and to load special software into the host to translate conventional operating system (e.g., DOS) commands into flash commands and procedures for assertion to the flash memory. This approach uses the host computing power to act as a controller for the utility that manages the flash memory (rather than including such a controller in the flash memory itself).

Another approach is to make the interface to the flash memory identical to a conventional interface to a conventional magnetic hard disk drive. This approach has been analyzed by the PCMCIA standardization committee, which committee has promulgated a standard for supporting flash memory systems with a hard disk drive protocol. A flash memory card (including one or more flash memory array chips) whose interface meets this standard can be plugged into a host system having a standard DOS operating system with a PCMCIA-ATA (or standard ATA) interface. Such a flash memory card is designed to match the latter standard interfaces, but must include an onboard controller which manages each flash memory array independent of the host system. This approach has several advantages, including the following: there are no special system requirements for the host system (so ease of host system design is assured); no extra memory is required in the host, allowing for better use of the host memory; and the flash memory system runs independently of the host, freeing the host computer to do other tasks while the flash memory is storing or retrieving data from a flash memory array. However, the approach requires a controller onboard the flash memory to implement the equivalent of an operating system behind the disk and PCMCIA interface.

In storing sectors or files of data in a flash memory, several problems exist when trying to emulate a DOS file structure and magnetic disk drive data storage methodology. These problems differ, depending on the structure of the flash memory.

For specificity, consider a flash memory array having the structure shown in FIG. 2. This structure may be suitable for low cost applications of the type commonly implemented using low cost magnetic disk drives. Memory array 16 of FIG. 2 has 544 bytes per row of cells (each byte consisting of eight bits, where each memory cell is capable of storing one bit). Thus, each row of cells is equivalent to a magnetic disk sector (512 bytes of data plus 32 bytes of "overhead").

Memory array 16 of FIG. 2 is partitioned into large "decode" blocks of cells (e.g., eight large decode blocks as shown in FIG. 2) that are physically isolated from one another. This partitioning of blocks allows defects in one decode block (e.g., decode block 16A) to be isolated from the other decode blocks in the array, allows defective decode blocks to be bypassed by a controller, and allows for high usage of die and enhances overall yield of silicon produced (driving down the cost of flash mass storage systems).

Throughout this disclosure, the expression "decode block" is used to denote a block of cells of a memory array which are sufficiently physically isolated from the other cells of the array that the disturb effect on the cells in the decode block (due to high voltage application to the other cells of the array, e.g., during erasing or programming of the other cells) is negligible. In one case, an entire memory array is a single decode block. More typically, a memory array includes two or more decode blocks.

The invention contemplates that each decode block is subdivided into a number of independently erasable blocks (e.g., eight "erase" blocks as shown in FIG. 2), sometimes referred to herein as "erase blocks." In the FIG. 2 example, each erase block (e.g., erase block 16B) consists of rows of flash memory cells, with each row being capable of storing seventeen "packets" of bits, and each packet consisting of 32 bytes (each byte consisting of eight bits). Thus, each row (capable of storing 544 bytes) corresponds to one conventional disk sector (comprising 544 bytes), and each row can store 512 bytes of user data as well as a field of 32 ECC bytes for use in error detection and correction and other bits associated with sector management. In the FIG. 2 example, each erase block corresponds to two "cylinders" of data (in the sense that this expression is used in a conventional magnetic disk drive), with each cylinder consisting of 256K bits of data organized into 64 sectors. Thus, each erase block in the FIG. 2 example consists of 128 sectors of data.

Still with reference to FIG. 2, each erase block (e.g., erase block 16B) can be independently erased in response to signals from the controller. All flash memory cells in each erase block are erased at the same (or substantially the same) time, so that erasure of an erase block amounts to erasure of a large portion of array 16 at a single time. During erasure (or programming) of one erase block, the other erase blocks in the decode block that are not erased (or programmed) are subject to array stresses as the one erase block is erased (or programmed).

As each erase block is programmed and later erased as part of a decode block, the other erase blocks in the decode block are affected by this activity (in the sense that high voltage stresses resulting from the programming and erase operations are seen by the cells comprising the other erase blocks). The effect of an erase (or programming) operation in one portion (e.g., an erase block) of an array on another portion (e.g., another erase block) of the array is known as "disturb." Even where each erase operation produces only a small disturb effect, if this effect is not taken into consideration when building a flash memory (especially one which emulates a disk drive) and if preventive measures are not taken to nullify the accumulated disturb effects of many program and erase operations, the accumulated effects of many program and erase operations will result in failures (upon reading data from the blocks subject to the disturb effect).

In many normal usages of flash memory systems, the entire memory is written (or erased) or entire decode blocks are written (or erased) at one time, which minimizes the disturbs (from each erase block to other erase blocks) which occur. However, in a disk emulation system this is not possible, as the data is very dynamic with small portions (e.g., individual rows) being rewritten many times while other small portions remain unchanged. To accomplish the latter type of data updating, the controller will write data to free locations (e.g., rows) and when the memory is to be updated it will write the new (updated) data to other free rows (not previously written), marking the previously written rows as old (obsolete, and ready to be erased). The system will keep track of these obsolete rows and will erase an entire erase block when it becomes filled or almost filled with obsolete rows. Updated data (to replace data in one row of one erase block) may be placed in another erase block or even another decode block or possibly even a different flash memory chip. The constant rewriting and moving of files will result in erase blocks being constantly programmed and erased. In DOS it is typical for new files to be updated heavily and unused files to be not updated or never changed once generated. This typical use of files will result in portions of memory being updated frequently while other areas will remain stagnant and unchanged. The files and data space being constantly updated pose no problem as they are updated before the surrounding disturbs can cause a problem. The areas of potential failure (in a flash memory system emulating a magnetic disk drive) are the erase blocks within a decode block that are not changing, but are subject to disturbs due to programming and erasures of other erase blocks within the same decode block.

As these disturb conditions exist and are induced on the stored data, the unchanging cells (which store data that is not changed) will tend to lose charge from their floating gates. This charge loss will result in each programmed cell (which stores a data bit indicative of a logical "zero" before occurrence of the disturb effect) gradually moving to a state in which a read operation will indicate (erroneously) that it stores a logical "one" bit. In other words, at some point, this charge loss will result in enough loss that the sense amplifier trip point will no longer see the cell as being programmed and will detect it as an erased cell. Once this has occurred within the memory we will have a data bit failure or several data bit failures.

To better appreciate the manner in which the disturb effect can occur, consider an example in which the following sequence of operations is performed on the eight erase blocks of decode block 16A of FIG. 2 (where the erase blocks of decode block 16A are denoted in the example as Block 0, Block 1, Block 2, Block 3, Block 4, Block 5, Block 6, and Block 7, respectively, in order of increasing distance from the top of FIG. 2): first, all of Blocks 0 through 7 are programmed; then, Block 1 is erased and programmed; then, Block 2 is erased and programmed; then, Block 5 is erased and programmed; then, Block 6 is erased and programmed; then, Block 1 is erased and programmed; then, Block 1 is erased and programmed; then, Block 1 is erased and programmed; and finally, Block 7 is erased and programmed. Following this sequence of operations, Blocks 1 and 7 are least likely to produce a read failure due to the disturb effect (since their cells are the ones most recently updated) and Blocks 0, 3, and 4 are most likely to produce a read failure due to the disturb effect (since their cells are the ones which were exposed to the disturb effect for the longest time following the initial programming of all cells, and are thus the cells likely to have suffered the greatest loss of charge on their floating gates due to the disturb effect). In other words, Blocks 0, 3, and 4 have been subjected to the most disturb without having been updated themselves, and so they are the erase blocks most likely to see a disturb condition which would cause a read failure (an erroneous read of one of the cells) during a subsequent read of all cells of the decode block.

In designing a flash memory system which emulates a magnetic disk drive, it would be ideal to prevent occurrence of the disturb effect by sufficiently isolating small individual blocks of memory cells so no disturbs would occur. However, this ideal solution is impractical if low cost is a criterion for market success, as it is for mass storage systems. However, it often is practical to design a flash memory array that is composed of large decode blocks, where each decode block is effectively isolated from other decode blocks (and thus is not subject to the disturb effect due to programming or erase operations on other decode blocks).

The present invention provides a method and apparatus for accounting for the number of times each erase block (of a decode block) is subjected to the disturb effect due to erasure of other erase blocks in the decode block (without itself undergoing erasure). Thus, the invention allows corrective action to be taken whenever an erase block has been subjected to a predetermined maximum allowable level of the disturb effect. Preferred embodiments of the invention implement such corrective action by performing a refresh operation on each erase block when the decode count for that erase block has reached a predetermined maximum value.

SUMMARY OF THE INVENTION

In a preferred embodiment, the invention is a memory circuit including an array of flash memory cells organized into one or more decode blocks (or two or more such arrays), and a means for monitoring the disturb effect on each independently erasable "erase" block of flash memory cells (of each decode block) due to erasures of other erase blocks in the same decode block. Preferably, the monitoring means is a controller for controlling memory operations of each array, where the controller is also programmed to monitor and account for the disturb effect on each erase block. The disturb effect causes cells of each erase block to lose charge from their floating gates each time an erase (or programming) operation is performed on other erase blocks in the same decode block.

In accordance with the invention, the monitoring means keeps a count for each erase block. Each time an erase block is erased, a unit of disturb is added to the count for each other erase block in the same decode block that is not being erased. The erase block being erased, on the other hand, has its disturb count reset to a decreased value (preferably to a value indicative of zero units of disturb, i.e., a disturb count of zero), since it has lost all its data and is in a new, undisturbed state. Preferably, each time an erase block is erased, the monitoring means (which can be a controller) updates a table for the relevant decode block by adding a unit of disturb for each other erase block in the decode block and resetting the count for the block erased to zero. The monitoring means preferably maintains such a table for each decode block.

Preferably also, the system includes means for performing a refresh operation on each erase block whose disturb count reaches a predetermined maximum value. During such a refresh operation, any necessary recovery procedures are performed to restore the proper charge to the floating gate of each cell of the erase block, thereby preventing any erroneous reads of data that would otherwise occur (due to the disturb effect) absent the refresh operation.

Also within the scope of the invention is the method implemented any of the described embodiments of the memory circuit of the invention.

The invention is a simple, low overhead solution that does not require elaborate block management and can be implemented as a background event. No long counters are required and no extensive interpretation overhead is required to implement the invention. With normal file movement (typical sequences of programming and erasing operations on blocks of cells of a flash memory system, even where the flash memory system emulates a magnetic disk drive) the entire procedure of the invention (including execution of a refresh routine) will be a simple procedure with a refresh operation being a relatively rare event.

In accordance with the invention, a disturb count table is stored for each decode block, to track the disturb rate being seen by the entire memory (including all its decode blocks). Preferably, some disturb factor associated with both program and erase operations is calculated or experimentally derived. This disturb factor determines a maximum number of cycles that each erase block can be subjected to before it experiences a bit failure due to the disturb effect. This maximum count is used to set the refresh count limit. This limit may vary over time (and over changes in program and erase algorithms), and is preferably made a variable that can be different for each decode block in the memory system (or for each memory array in a system including multiple memory arrays, where each array is implemented by a different memory array chip).

DETAILED DESCRIPTION OF THE PREFERRED EMBODIMENTS

Figure 1:
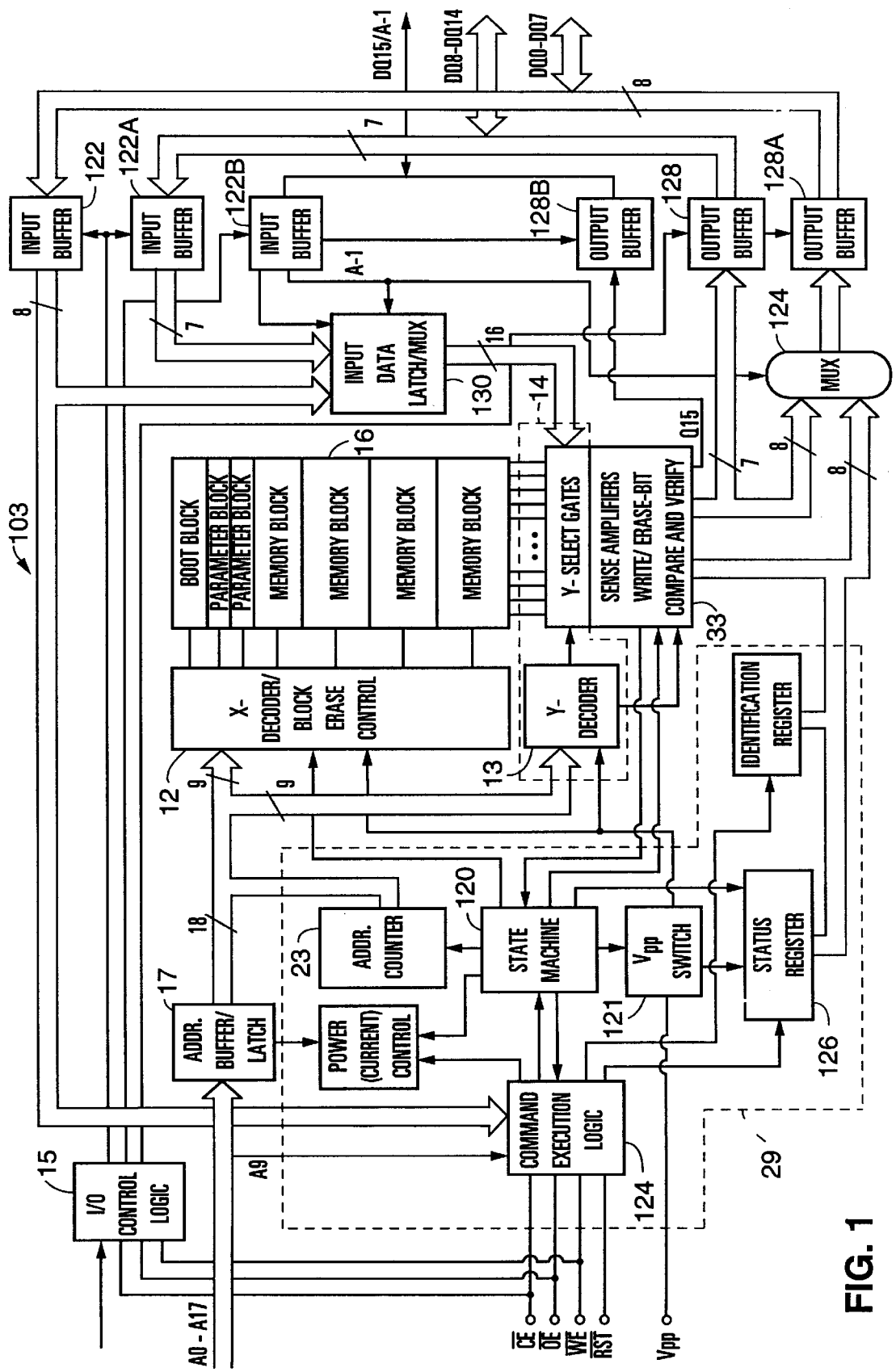
FIG. 1 is block diagram of a conventional nonvolatile (flash) memory circuit (implemented as an integrated circuit), including a conventional controller for controlling memory operations of the circuit.
Figure 3:
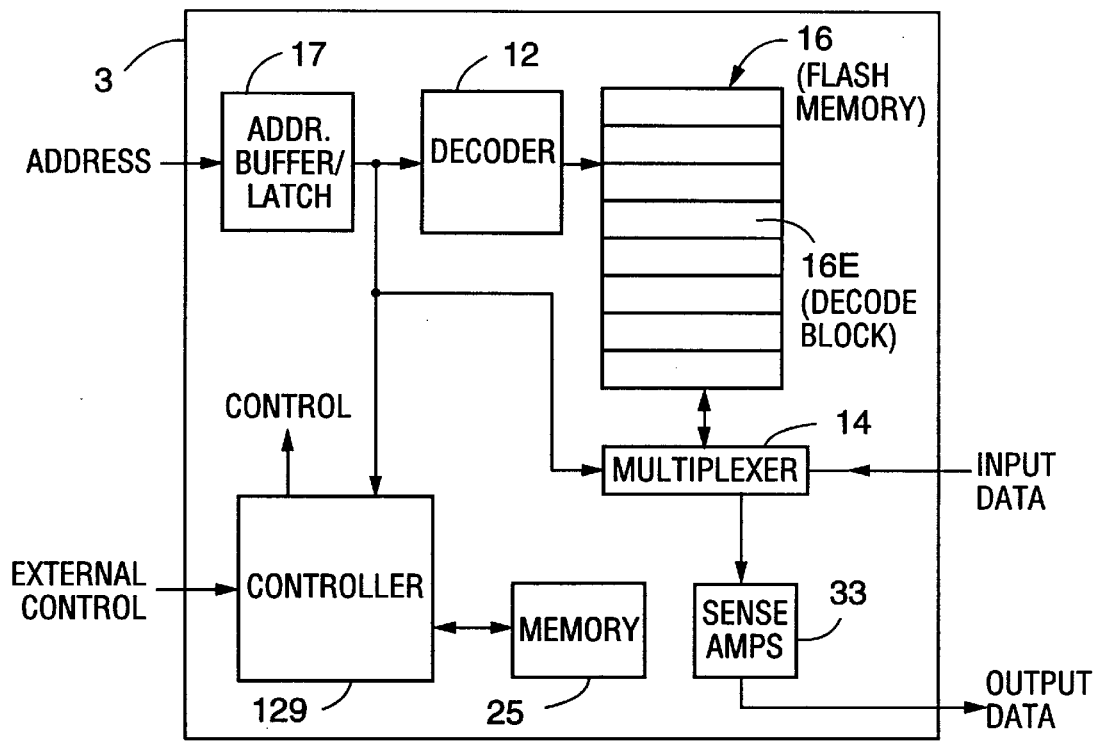
FIG. 3 is a block diagram of an embodiment of the integrated flash memory system of the invention.

Several embodiments of the invention will be described with reference to FIGS. 3, 4, 5, and 6. One such embodiment is flash memory chip 3 shown in FIG. 3 which includes controller 129 which is programmed in accordance with the invention, and memory 25 for storing the disturb count for each erase block of flash memory cell array circuit 16. In one implementation, memory chip 3 of FIG. 3 is identical to chip 103 of FIG. 1, except in that chip 3 includes controller 129 (which is programmed to implement the monitoring means of the invention) rather than controller 29, and in that chip 3 includes memory 25 for storing the disturb count for each erase block of array 16. In such an implementation of chip 3, those components of FIG. 3 which are identically numbered in FIGS. 1 and 3 are identical to their counterparts in FIG. 1, and the description of these components (provided above with reference to FIG. 1) will not be repeated below. In alternative implementations of chip 3, those components of FIG. 3 which are identically numbered in FIGS. 1 and 3 perform the same functions as do their counterparts in FIG. 1.

Controller 129 is preferably programmed with software for generating the disturb counts (and storing each updated set of disturb count signals in memory 25 in place of the previous set of disturb count signals) in accordance with the invention, and also with software for performing the inventive refresh operation (to be described below) on each erase block whose disturb count reaches a predetermined maximum value. Throughout the specification, including in the claims, the expression that a device is "programmed with software" for performing an operation in accordance with the invention is used in a broad sense to denote that the device includes software, firmware, or dedicated hardware which gives the device the capability of performing the operation. Also throughout the specification, including in the claims, the term "circuitry" is used to denote any hardware comprising active and/or passive electrical components (e.g., semiconductor devices, tubes, resistors, etc.) whether or not such hardware is programmed with software (unless the term "circuitry" is qualified to refer to a narrower class of such hardware). A general purpose processor which includes transistors or other electrical components and which is programmed with software causing the processor to process electrical signals (indicative of binary data) that it receives in accordance with an algorithm is an example of "circuitry" within the scope of this definition.

It is contemplated that controller 129 can be (or include) a general purpose processor programmed with software enabling the processor to perform an operation in accordance with the invention (e.g., in response to external signals from a host specifying erase operations on memory array 16), or that controller 129 can consist of (or include) special purpose hardwired logic circuitry for performing the same operation (e.g., to generate a set of updated disturb count signals that could alternatively be generated by a general purpose processor programmed with software).

Figure 2:
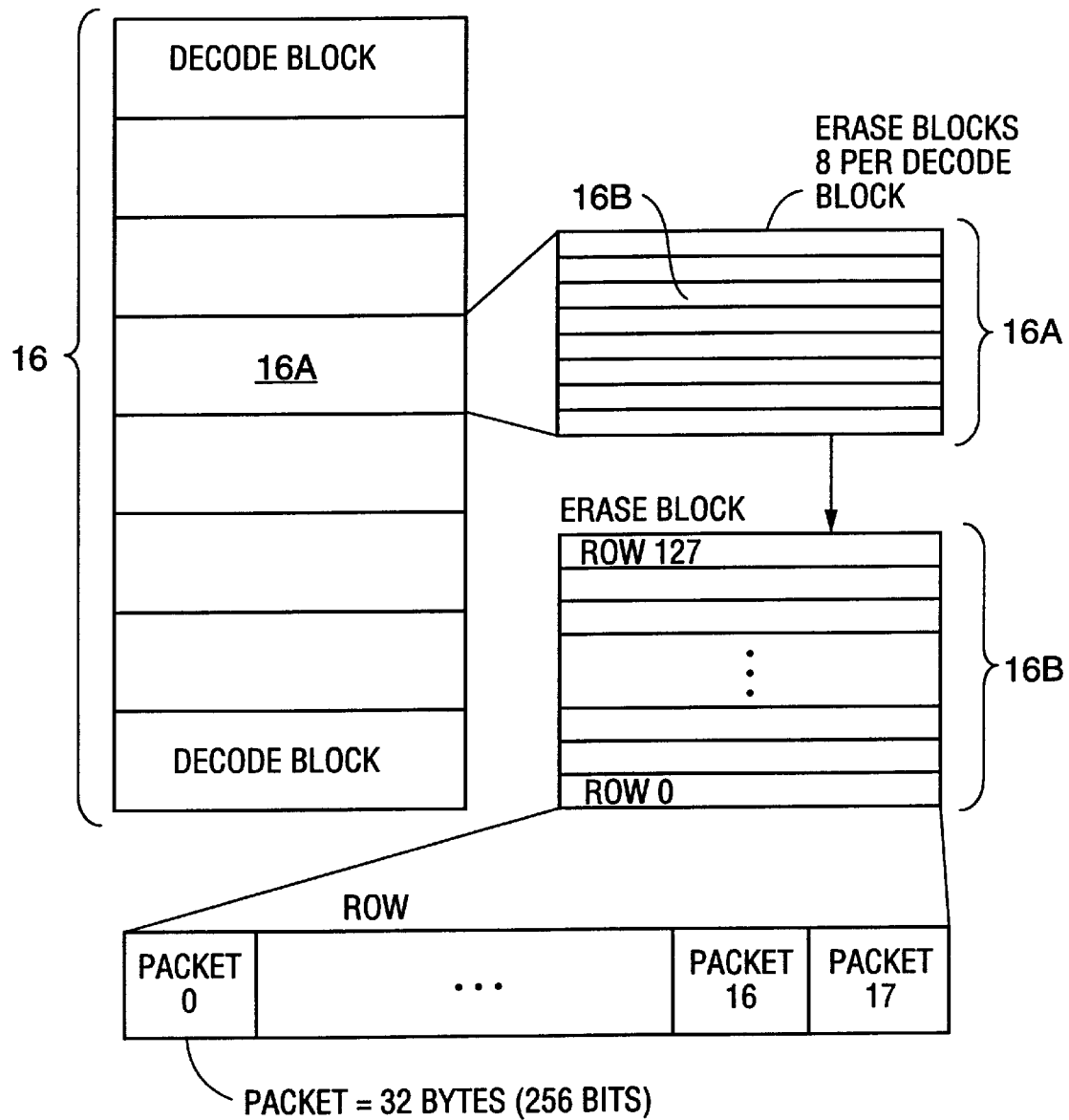
FIG. 2 is a diagram of the manner in which cells of a flash memory array are organized in one flash memory system which emulates a magnetic disk drive.

The cells of flash memory array 16 (of both FIG. 1 and FIG. 3) are organized into decode blocks (e.g., decode block 16E shown in FIG. 3). Each decode block is organized into independently erasable erase blocks (as is each decode block of array 16 shown in FIG. 2).

In response to control signals (commands) from an external host, controller 129 of FIG. 3 asserts control signals to appropriate components of chip 3 as required to implement each memory operation specified by each command from the host (e.g., a read of some or all cells of array 16 determined by address bits asserted to circuit 17, an erase of one or more erase blocks of array 16, or programming operation on some or all cells of array 16).

Controller 129 is programmed to monitor the disturb effect on each erase block (of each decode block of array 16) due to erasures of other erase blocks in the same decode block. The disturb effect causes flash memory cells of each erase block to lose charge from their floating gates each time an erase operation is performed on other erase blocks in the same decode block. More specifically, controller 129 keeps a disturb count for each erase block, and causes memory 25 (preferably implemented as an SRAM) to store data indicative of the disturb count for each erase block of array 16. In addition to storing the disturb count in memory 25, controller 129 preferably stores this data in nonvolatile memory array 16 to prevent loss of data when the system is powered down. The disturb count table stored in array 16 is loaded (booted) into memory 25 upon power up of the system.

Each time an erase block is erased, controller 129 adds a unit of disturb to the count for each other erase block in the same decode block that is not being erased. More specifically, if the disturb count for a first erase block is "N" before an erase is performed on a second erase block in the same decode block as the first erase block (where N is an integer), controller 129 generates a data signal indicative of the value "N+1" while it controls the erasure of a second erase block in the same decode block, and controller 129 writes this data signal to the memory location in memory 25 which corresponds to the first erase block (to replace the stored data value therein indicative of the former count "N"). Controller 129 also resets the disturb count for the erase block being erased (the "second" erase block, in the example), since the erased block has lost all its data and is in a new, undisturbed state.

Thus, each time an erase block is erased controller 129 updates the contents of memory 25. At any instant, memory 25 stores data indicative of a table of disturb counts for each decode block of array 16 (preferably, this table is also written to flash memory array 16 for nonvolatile storage as mentioned above).

Preferably, controller 129 is also programmed to perform a refresh operation on each erase block whose disturb count reaches a predetermined maximum value. During such a refresh operation, any necessary recovery procedures are performed to restore the proper charge to the floating gate of each cell of the erase block, thereby preventing any erroneous reads of data that would otherwise occur (due to the disturb effect) absent the performance of the refresh operation.

We next describe a preferred technique for determining the predetermined "maximum value" of the disturb count (which is mentioned in the previous paragraph). It is well known that each memory design and process has its own unique disturb characteristics and rates to failure. These parameters are typically kept confidential by each memory manufacturer. Thus, where the invention is constructed using one or more commercially available flash memory arrays, the disturb characteristics and rates of each array will typically not be known "a priori."

For an erase block of a flash memory array, the "program disturb time" (the average or typical time, of exposure of an erase block to programming operations on other erase blocks in the same decode block, that is required to cause a failure due to the disturb effect during a subsequent read of the erase block) is typically different than the "erase disturb time" (the average or typical time, of exposure of an erase block to erase operations on other erase blocks in the same decode block, that is required to cause a failure due to the disturb effect during a subsequent read of the erase block) for the same erase block.

In preferred embodiments of the invention, the predetermined "maximum value" of the disturb count (sometimes denoted herein as "MAX COUNT") for an erase block (or for all erase blocks in a decode block, or for all erase blocks in the entire memory array) is determined from some combination of the program disturb time and erase disturb time for the erase block (or all erase blocks in the decode block or the entire memory array). The latter combination (which may assign zero weight to the program disturb time) will be denoted herein as "T" (or the "total time to disturb"). In accordance with the invention, "T" for each erase block is determined by theory and measurement. After "T" has been determined, the value $C=T/T_E$ is determined, where $T_E$ is the disturb time per erase (i.e., the duration of an erase operation on an erase block). The value C is a unit of "disturb" (i.e., a maximum number of erase operations to which each erase block can be subject before failure). The maximum value of the disturb count ("MAX COUNT") is determined to be the value C reduced by some selected safety factor (e.g., MAX COUNT may be 50% of C). MAX COUNT represents a maximum count any erase block can be subjected to before a problem arises.

In accordance with the invention, the amount by which each erase block is exposed to the "disturb effect" is tracked by counting the number of disturb units that the erase block sees from its surrounding erase blocks within this decode block (i.e., for a given erase block, the number of erase operations performed on other erase blocks in the same decode block since the given erase block was last erased).

In preferred embodiments of the invention, controller 129 keeps such a count for each erase block. As an erase operation is performed on an erase block (typically this occurs when the block has become full of "old" or obsolete rows of data, as mentioned above), controller 129 adds a unit of disturb to the count for each of the other erase blocks (in the same decode block) that are not being erased. The block being erased, on the other hand, has its disturb count reset to zero. Controller 129 stores the updated counts in memory 25 (and preferably also in flash memory array 16).

To better understand tracking of disturb units and table updates associated with each disturb unit in accordance with the invention, consider again the above-described count sequence for a decode block. This sequence is performed on the eight erase blocks comprising one decode block of array 16 of FIG. 3 (e.g., decode block 16E shown in FIG. 3, where the erase blocks of decode block 16E are Block 0, Block 1, Block 2, Block 3, Block 4, Block 5, Block 6, and Block 7) and consists of the following steps: all of Blocks 0 through 7 are programmed; then, Block 1 is erased and programmed (the "first" step); then, Block 2 is erased and programmed (the "second" step); then, Block 5 is erased and programmed (the "third" step); then, Block 6 is erased and programmed (the "fourth" step); then, Block 1 is erased and programmed (the "fifth" step); then, Block 1 is erased and programmed (the "sixth" step); then, Block 1 is erased and programmed (the "seventh" step); and finally, Block 7 is erased and programmed (the "eighth" step). The table of decode counts stored in memory 25 after each step of the sequence would look as follows:

| | Erase Sequence Step | | | | | | | |
|---|---|---|---|---|---|---|---|---|
| Block Number | 1st | 2nd | 3rd | 4th | 5th | 6th | 7th | 8th |
| 0 | 1 | 2 | 3 | 4 | 5 | 6 | 7 | 8 |
| 1 | 0 | 1 | 2 | 3 | 0 | 0 | 0 | 1 |
| 2 | 1 | 0 | 1 | 2 | 3 | 4 | 5 | 6 |
| 3 | 1 | 2 | 3 | 4 | 5 | 6 | 7 | 8 |
| 4 | 1 | 2 | 3 | 4 | 5 | 6 | 7 | 8 |
| 5 | 1 | 2 | 0 | 1 | 2 | 3 | 4 | 5 |
| 6 | 1 | 2 | 3 | 0 | 1 | 2 | 3 | 4 |
| 7 | 1 | 2 | 3 | 4 | 5 | 6 | 7 | 0 |

The counts in the above table are for a single decode block. The counts for each decode block of array 16 would similarly be updated (and stored in memory 25, and preferably also in flash memory array 16) each time an erase operation occurred therein.

Each time controller 129 updates the disturb count for a decode block, controller 129 preferably also compares the count for each erase block within that decode block against the maximum count allowed for the decode block (a predetermined value "MAX COUNT" of the type described above for the cells in the decode block). If the updated disturb count is less than MAX COUNT, controller 129 takes no further action, other than updating the table of disturb counts stored in memory 25. If the disturb count for an erase block is found to be equal to MAX COUNT, controller 129 performs a refresh operation on the corresponding erase block.

In essence, the refresh operation is a read of all cells of the erase block with low margins to see if any bits that have been programmed but not intentionally erased have come out of (or are coming out of) the programmed state. If no such undesirable condition is found (i.e., if no error is found), the disturb count for the erase block is reset to some intermediate value (e.g., some value less than MAX COUNT). For example, the intermediate value can be MAX COUNT/N, where N is number greater than one (e.g., N=2), or the intermediate value can be (MAX COUNT–M), where M is a positive integer. If an error is found, the cell or packet of cells containing the error is identified (e.g., by processing ECC bits stored with the data of interest in the erase block). The controller then causes the erase block to be read under a normal margin or adjusted margin, to determine whether this read can be accomplished with no error. If the latter read is accomplished with no error, the controller then takes the read data (which is "good" data, and which is stored in a buffer) and rewrites the failing packet with the good data, driving the failing programmed bits back into the proper programmed state. The controller then causes the system to do another read with low margins, checking if the rewrite (refresh) was a success. If the rewrite was a success, the disturb count for the erase block is set to the intermediate value (a value less than MAX COUNT). If the rewrite was not a success, the good data in the buffer is written in another sector of the flash memory array and the old sector is marked as being "old" or "obsolete." This procedure is repeated for each sector of the entire erase block being refresh checked. Preferably, the controller determines the sector which corresponds to each "old" sector by processing the disturb counts (e.g., in the manner discussed below).

Figure 4A:
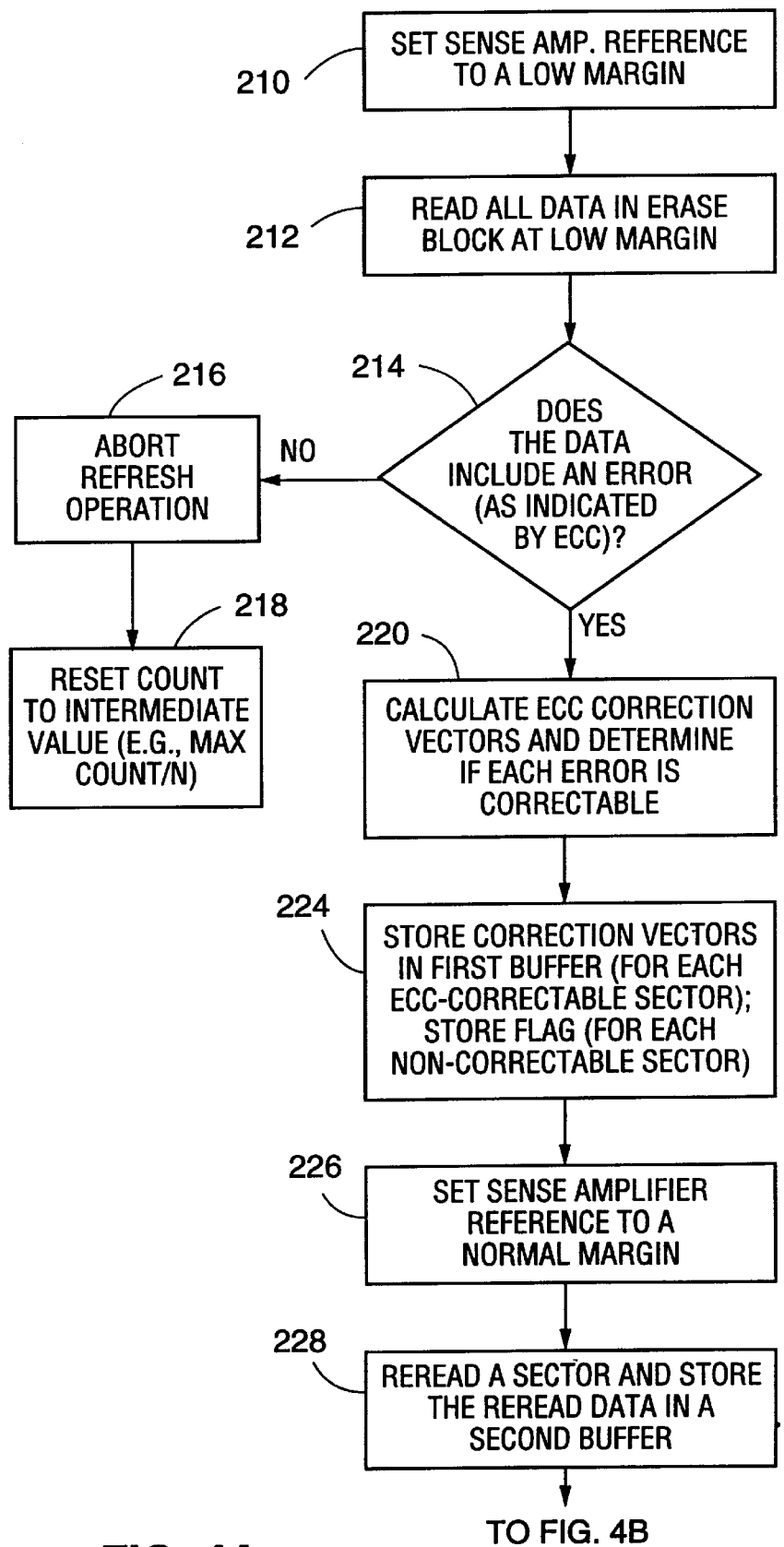
FIG. 4 (consisting of FIGS. 4A, 4B, 4C, and 4D) is a flow chart of a refresh operation, which is a part of a preferred embodiment of the method of the invention.
Figure 4C:
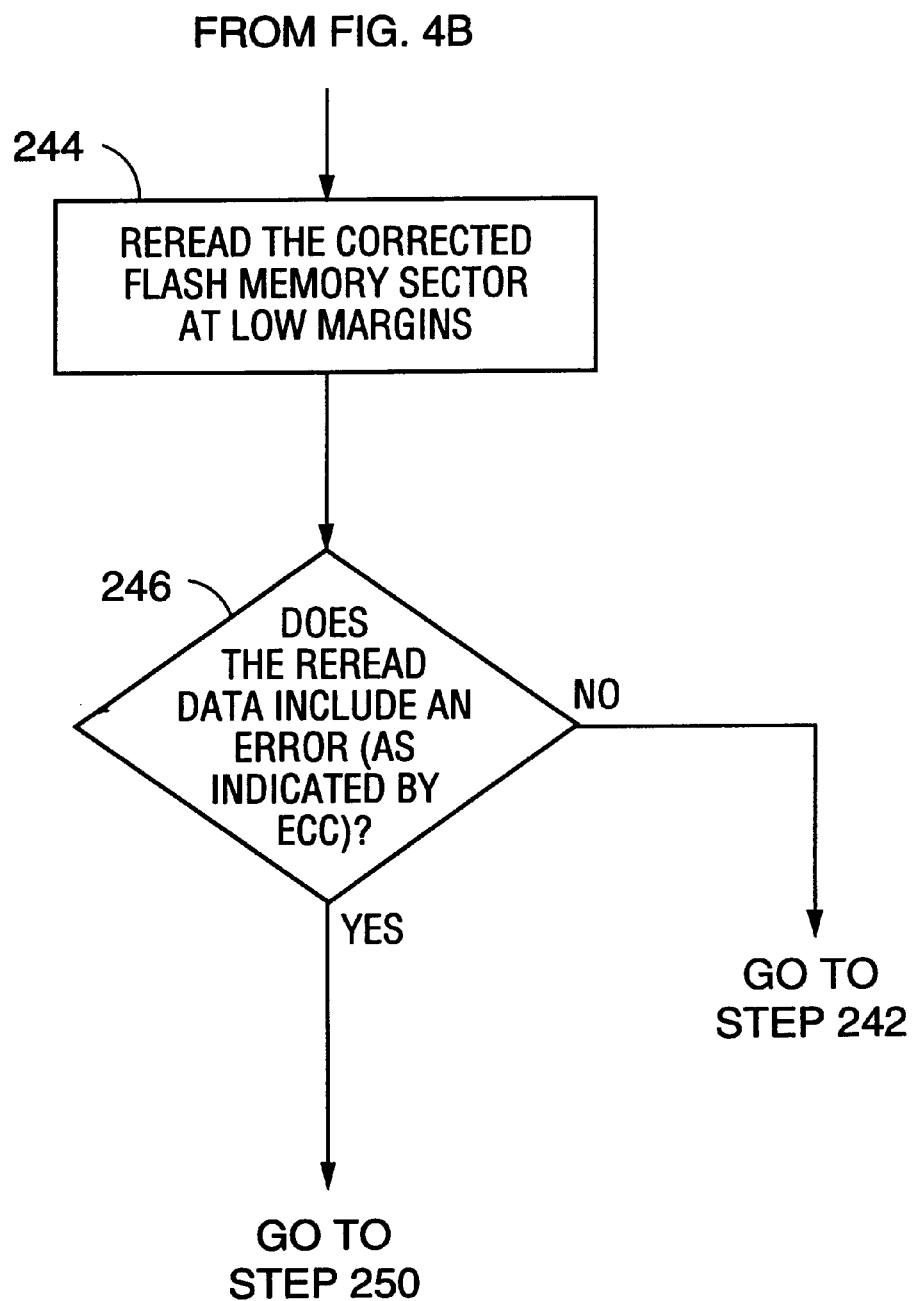
Figure 4D:
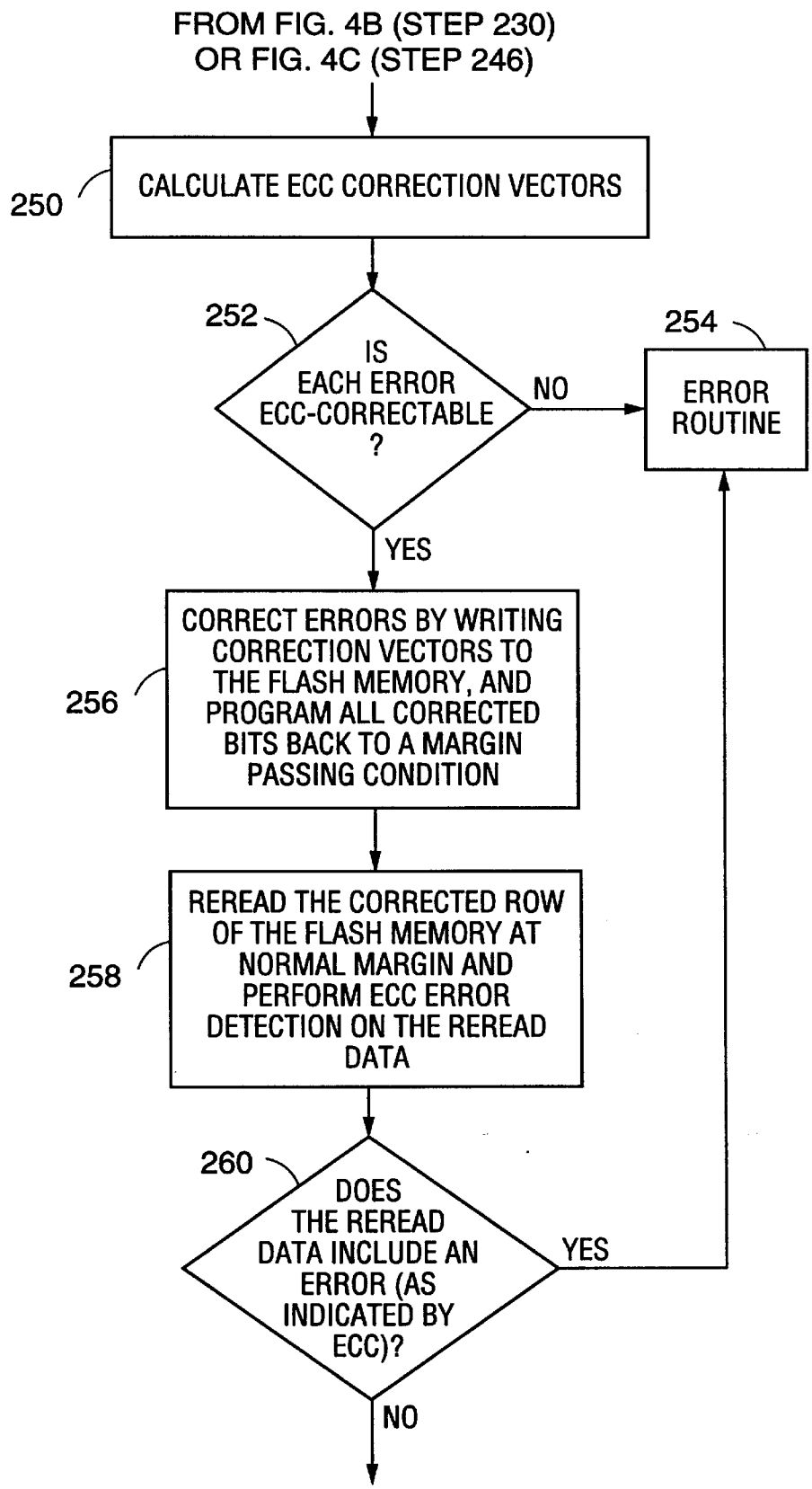

We next describe a preferred embodiment of such a refresh operation with reference to FIG. 4. The following description of FIG. 4 assumes that each row of the flash memory array corresponds to a magnetic disk sector, and thus the expressions "row" of bits and "sector" of bits are used interchangeably in describing FIG. 4. FIG. 4 consists of four portions, labeled as FIG. 4A, FIG. 4B, FIG. 4C, and FIG. 4D.

The initial step of the refresh operation of FIG. 4 (step 210) is to set the memory to a low margin sense amplifier state. In other words, the reference voltage of each sense amplifier employed to read the cells of the erase block (the erase block undergoing the refresh operation) is set to a level (between the threshold voltage of a programmed cell and the threshold voltage of an erased cell) closer to the threshold voltage of a programmed cell than to the threshold voltage of an erased cell. With the sense amplifiers operating in the low margin state, there is significantly less margin for reading a cell as being programmed than for reading a cell as being erased (so it is significantly more "difficult" for a programmed cell to be read properly than for an erased cell to be read properly. This allows the controller to assess whether a subsequent read of each programmed cell (with normal sense amplifier margins) will likely read each such cell properly as a programmed bit (even when the subsequent read operation is performed after the erase block has been exposed to further disturbs).

After step 210 (during step 212), all the cells in the erase block are read (at the low margin). Then (in step 214), error detection is performed on the data read in step 212 using the ECC bits thereof. The read at low margin will detect charge loss in cells that are moving from a "0" (programmed) state toward a "1" (erased) state.

If error detection step 214 indicates no error in the data that has been read at low margin, the refresh operation is aborted (step 216) and the disturb count for the erase block is reset (step 218) to an intermediate value. This intermediate value is a value less than MAX COUNT, such as (MAX COUNT)/(N), where N is greater than one. Typically, N=2, so that the intermediate value is equal to half of MAX COUNT. The resetting of the disturb count to the intermediate value is done to allow for a subsequent refresh check of the erase block at some earlier time than if the disturb count for the block were instead reset back to zero.

If error detection step 214 indicates an error in the data that has been read at low margin, the controller (e.g., controller 129 of FIG. 3, or controller 201 of FIG. 6) takes corrective action by doing a series of recovery procedures (steps 220, et seq.). The first step in the recovery process (step 220) is store (e.g., in a buffer memory) addresses and correction vectors for each sector containing a detected error which is ECC correctable, and to store a flag identifying each sector containing a detected error which is not ECC correctable.

Then, in step 224, the controller resets the memory to a normal margin sense amplifier state. Then, in step 228, the controller causes one row (sector) of the erase block to be read again (at normal margins), and stores the reread data in a second internal buffer memory.

Then, in step 230, error detection is performed by processing the ECC bits of the data reread in step 228. If this ECC error detection operation identifies no error, the reread sector of data (stored in the second buffer) is used to refresh the failing location (in below-described steps 236–247).

More specifically, if error detection step 230 identifies no error for a sector, the controller performs step 236 in which it places the memory into the low margin mode by appropriately controlling the reference voltage to each sense amplifier for reading the erase block. Then, the sector is read again at low margin (step 238). The data read in step 238 is then compared (in step 240) with the corresponding sector of data stored in the second buffer during the immediately preceding iteration of step 228 (the data in the second buffer has just been determined to be error-free under normal margins during step 230). During step 240, any mismatches are identified between each bit of the sector as read (during step 228) with normal margins and the corresponding bit as reread (during step 238) with low margins. In response to each such mismatch, the controller replaces the mismatching bit reread from the flash memory (which will always be an "erased" bit) with the corresponding bit from the second buffer (which will always be a programmed bit), and the controller causes all the corrected (replaced) bits to be programmed back to a margin passing condition (step 241).

After step 241, the corrected sector of the flash memory is read another time at low margins (step 244). Then, in step 246, error detection is performed by processing the ECC bits of the data reread in step 244.

If ECC error detection step 246 identifies no error, the controller then performs step 242. During step 242, the controller determines whether step 228 has been performed for all sectors of the erase block. If not, another iteration of step 228 is then performed for another flash memory sector (as indicated as step 243 in FIG. 4B). If so (if step 228 has been performed for all sectors), above-described steps 216 and 218 are then performed.

If error detection step 246 does identify an error for the sector, the controller performs step 250 (to be described below). In essence, by performing step 250 (and subsequent steps 252–260 to be described below), the controller attempts to perform ECC error correction on the sector of data read during step 244.

With reference again to above-discussed ECC error detection step 230, if step 230 identifies an error in the sector (the sector read at normal margins and stored in the second buffer during step 228), an attempt is made to perform ECC error correction on this sector of data (by performing steps 250 and 252 and then appropriate ones of steps 254–260). In step 250, the controller calculates the ECC correction vectors for a sector of data (this is the sector in the second buffer if step 250 is reached from step 230, or it is the sector read during step 244 if step 250 is reached from step 246).

After step 250, step 252 is performed to determine whether each error detected in the immediately preceding error detection step (step 230 or step 246) is ECC correctable. If the errors detected in the immediately preceding error detection step are determined not to be ECC correctable, an error routine is performed (step 254). The error routine preferably includes the steps of marking the corresponding sector (row) of the flash memory as "obsolete," writing the (error-containing) data of the obsolete sector to another sector of the flash memory, and optionally performing additional recovery operations on the data written from the obsolete sector to the other sector.

If the errors detected in the immediately preceding error detection step (step 230 or step 246) are determined to be ECC correctable (in step 252), the relevant flash memory sector is corrected using the correction vectors calculated in step 250 and all corrected bits are programmed back to a margin passing condition (step 256). Since the disturb effect only causes errors which change a programmed bit to an erased bit (and not errors which change an erased bit to a programmed bit), the ECC correction operation performed in step 256 will replace only (erroneous) erased bits with (correct) programmed bits, and will not replace a programmed bit with an erased bit.

After step 256, the corrected sector of the flash memory is reread (at normal margins) and error detection is performed thereon by processing the ECC bits thereof (step 260). If this error detection operation identifies no error, above-described step 242 is performed (and another iteration of step 228 is then performed for another flash memory sector, or steps 216 and 218 are performed if step 228 has been performed for all sectors of the erase block).

If the error detection operation (step 260) identifies an error, the error routine (above-described step 254) is performed.

Preferably, for each erase block for which the disturb count reaches the predetermined maximum value (MAX COUNT), the refresh operation described with reference to FIG. 4 is performed on every sector in that erase block. The disturb count table (which is stored in memory 25 and preferably also in flash memory array 16, in the FIG. 3 embodiment) is updated according to the results of the refresh operation. Preferably, the disturb count for the erase block is reset to a different value depending on whether or not reprogramming of any cell was required as part of the refresh operation. It is contemplated that the controller will reset the disturb count for the block to a higher value if the erase block successfully underwent the refresh operation (i.e., if the refresh operation terminated other than with an error routine such as error routine 254 of FIG. 4) without any cell reprogramming, than in the case that reprogramming of one or more cells was required to cause the block to successfully undergo the refresh operation. The value to which the disturb count is reset in each context (e.g., above-discussed intermediate value MAX COUNT/N) and the maximum allowed disturb count for each erase block (e.g., above-discussed value MAX COUNT) can be determined based on experimental data taken while running the system (e.g., if disturbs are found during a refresh which occurs following a disturb count reset, then some higher reset count value could be used during subsequent refresh operations to give better data protection. It should be kept in mind that the normal cycling of erase blocks (during typical flash memory system operation) will often result in the disturb counts for most erase blocks being reset to zero before the maximum value MAX COUNT is reached. The value to which the disturb count is reset (in each context) can be dynamic (can change over time), can be based on process parameters, and can be different for each memory (or each memory array chip in a memory system including multiple memory array chips). A small table for use by the flash controller can be loaded once (at the time of manufacture) and used to apply the parameters on a chip by chip basis.

The relative disturb counts for the erase blocks within each disturb block themselves determine a figure of merit as to the hot or coldness of system usage of each erase block. This information can be used by the flash memory controller in determining relocation areas for storage locations that it designates as obsolete (e.g., a relocation sector corresponding to each obsoleted sector of an erase block undergoing a refresh operation). Through grouping of high count blocks and grouping of low count blocks, the system can achieve natural active and inactive areas of usage. This allows the system to reduce disturbs by physically separating the active areas from the inactive areas. Each active area can then be managed on the basis of additional criteria that will allow for moving data files (a reduced set) around the flash memory array to achieve natural wear leveling of the active files. By grouping data according to its level of activity ("hot" or "cold"), the number of refresh operations can be reduced or almost eliminated for better system performance.

It should be understood that although controller 129 is a component of the same integrated circuit (chip 3) as is flash memory array 16 in the FIG. 3 embodiment of the invention, in other embodiments of the invention the controller and flash memory array will be implemented in distinct chips. For example, it is contemplated that the invention can be embodied in a chip set (such as that shown in FIG. 5) which includes a controller chip and two or more memory array chips, each of which operates under control of the controller chip. Such a chip set can be implemented to emulate a magnetic disk drive (with the controller chip operating in response to commands received from a remote host). It is contemplated that the controller would be capable of performing a memory operation on any selected one of the memory array chips. For example, when it performs an erase of a selected erase block of a selected one of the memory array chips, it would update the disturb count for all the erase blocks of the disturb block of the selected memory array chip which contains the selected erase block. When the disturb count for one of the erase blocks of one of the memory array chips reaches the predetermined maximum value, the controller would perform the refresh operation of the invention on that erase block (preferably the preferred embodiment of the refresh operation described above with reference to FIG. 4).

Figure 5:
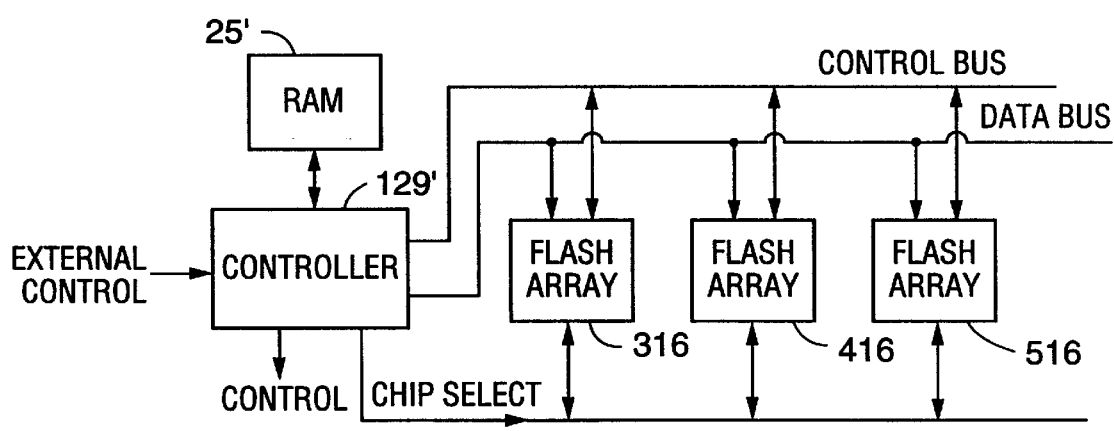
FIG. 5 is a block diagram of another embodiment of the flash memory system of the invention, including several flash memory arrays (each implemented as a separate integrated circuit) and a controller for controlling memory operations of any selected one of the arrays, monitoring the disturb effect on each erase block of each of the arrays, and performing a refresh operation on each erase block whose disturb count reaches a predetermined maximum value.

FIG. 5 is a block diagram of a multi-chip embodiment of the inventive flash memory system, including identical flash memory arrays 316, 416, and 516 (each implemented as a separate integrated circuit), controller 129', and random access memory 25'. Each of arrays 316, 416, and 516 comprises at least one decode block of flash memory cells (and preferably several such decode blocks), each decode block includes at least two erase blocks of cells, and each of the erase blocks includes at least one row of cells. Controller 129' includes means for controlling memory operations of any selected one of arrays 316, 416, and 516, means for monitoring the disturb effect on each erase block of each of the arrays, and means for performing a refresh operation (such as that described with reference to FIG. 4) on each erase block whose disturb count reaches a predetermined maximum value. Controller 129' can differ from controller 129 of FIG. 3 only in that controller 129' includes means for selecting one of the flash memory arrays (whereas controller 129 need not have such a capability). Memory 25' of FIG. 5 performs the same function as memory 25 of FIG. 3, except that memory 25' stores the disturb counts for all erase blocks of all of arrays 316, 416, and 516 (unlike memory 25 which stores disturb counts for only a single flash memory array). Alternatively, memory 25' and controller 129' are implemented together, as a single integrated circuit.

Figure 6:
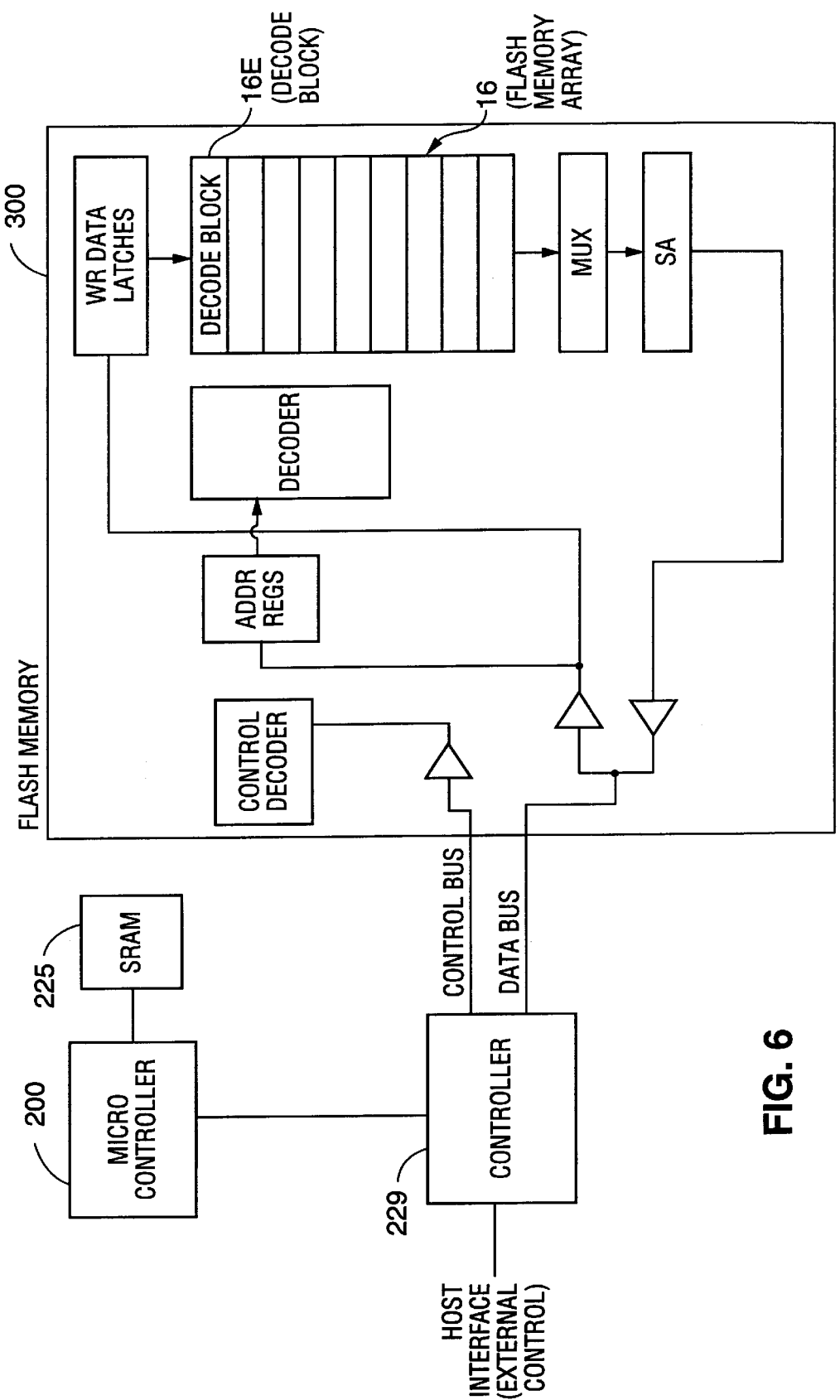
FIG. 6 is a block diagram of another embodiment of the flash memory system of the invention.

Another embodiment of the flash memory system of the invention is shown in FIG. 6. In the FIG. 6 embodiment, flash memory chip 300 is controlled by an external controller chip 229. Flash memory chip 300 includes an array 16 of flash memory cells, and array 16 consists of decode blocks of cells (such as decode block 16E). Controller 229 operates with microcontroller chip 200 and SRAM chip 225. In FIG. 6, chips 200, 225, and 229 together perform the functions of controller 129' and RAM 25' of the FIG. 5 embodiment with the following exception. Since the FIG. 6 system includes only a single flash memory chip (unlike the FIG. 5 system), chips 200, 225, and 229 in FIG. 6 need not implement the memory chip selection function implemented by controller 129' of FIG. 5. Flash memory chip 300 of FIG. 6 does not include control logic circuitry (of the type included in control unit 29 of memory chip 103 of FIG. 1), and instead controller 229 of FIG. 6 includes hardware and software for controlling memory operations of chip 300 (and for implementing the present invention).

Several embodiments of the method and apparatus of the invention have been described with reference to FIGS. 3–6. Although these embodiments have been described in some detail, it is contemplated that changes from these embodiments can be made without departing from the spirit and scope of the invention as defined by the appended claims.

What is claimed is:

1. A non-volatile memory device comprising:
   an array of non-volatile memory cells which can be either programmed or erased;
   disturb count circuitry which generates an output indicating a cumulative disturb effect on a first portion of the array as a result of erase operations performed on other portions of the array.

2. The non-volatile memory device of claim 1 further comprising:
   refresh circuitry adapted to refresh data stored on the non-volatile memory cells in response to the output of the disturb count circuitry.

3. The non-volatile memory device of claim 2 wherein the refresh circuitry initiates a refresh operation when the output indicates a disturb status above a predetermined value.

4. The non-volatile memory device of claim 1 wherein the array is arranged in a plurality erasable blocks of non-volatile memory cells.

5. The non-volatile memory device of claim 4 wherein the disturb count circuitry indicates a disturb count for each one of the plurality erasable blocks, whereby a disturb count is incremented for a first erasable block when a second erasable block is erased.

6. The non-volatile memory device of claim 1 wherein the array is arranged in a plurality of decode blocks, and the disturb count circuitry includes an erase count table for each decode block.

7. The non-volatile memory device of claim 6 wherein a content of the erase count table indicates a cumulative count of erase operations performed on portions of the array.

8. The non-volatile memory device of claim 6 further comprising a controller for updating the erase count table for each decode block, and comparing contents of the erase count table with a predetermined maximum value for each of the a plurality of decode blocks.

9. The non-volatile memory device of claim 8 wherein the controller resets the content of the erase count table upon completion of a refresh operation.

10. The non-volatile memory device of claim 8 wherein the controller corrects data failures in the array of non-volatile memory cells by reprogramming failed memory cells to have a passing data margin state.

11. A non-volatile memory device comprising:
    an array of non-volatile memory cells arranged in a plurality of blocks of memory cells;
    a count table associated with each of the plurality of blocks of memory cells for maintaining data indicating a cumulative disturb effect on a first block of the array as a result of erase operations performed on other blocks of memory cells;
    a controller for updating the count table for each block of memory cells, and comparing contents of the count tables with a predetermined maximum value for each of the plurality of blocks of memory cells.

12. The non-volatile memory device of claim 11 wherein the controller initiates a memory cell refresh operation based upon the comparison of the contents of the count tables with the predetermined maximum value.

13. The non-volatile memory device of claim 12 wherein the refresh operation comprises reading a state of a memory cell, determining if data stored in the memory cell has been disturbed, and re-writing data which has been disturbed.

14. The non-volatile memory device of claim 13 wherein the controller resets the contents of a count table to an intermediate value if the data stored in the memory cell has not been disturbed beyond a predetermined level.

15. The non-volatile memory device of claim 14 wherein the intermediate value is one-half of the predetermined maximum value.

16. The non-volatile memory device of claim 13 wherein the controller resets the contents of a count table when a corresponding block of memory cells is erased.

17. A non-volatile memory device comprising:
   an array of non-volatile memory cells arranged in a plurality of erasable blocks of memory cells, each block of memory cells arranged in a plurality of 544 byte rows;
   a count table associated with each of the plurality of blocks of memory cells for maintaining data indicating a cumulative disturb effect on a first block of the array as a result of erase operations performed on other blocks of memory cells;
   a controller for updating the count table for each block of memory cells, and comparing contents of the count tables with a predetermined maximum value for each of the plurality of blocks of memory cells, wherein the controller initiates a memory cell refresh operation based upon the comparison of the contents of the count tables with the predetermined maximum value.

18. A method of maintaining data in a non-volatile memory device, the method comprising the steps of:
   updating a table stored in the memory device, the table containing entries corresponding to locations of a memory array and indicating a relative data disturb as a result of erase operations performed on other locations of the memory array; and
   comparing the entries with a predetermined maximum disturb level to determine if a memory array location needs to be refreshed.

19. The method of claim 18 further comprising the steps of:
   checking a data level of memory cells located in a block of the memory having a corresponding entry in the table which exceeds the predetermined maximum disturb level; and
   performing an error correction operation on memory cells having a data error.

20. The method of claim 19 further comprising the step of:
   reprogramming the memory cells having a data error, such that data stored in the memory cells are reprogrammed to a passing margin state.

21. The method of claim 19 further comprising the step of:
   resetting the entries in the table corresponding to the block of the memory if a data error is not detected.

22. A method of identifying areas of a memory device which may be susceptible to data loss, the method comprising the step of:
   providing a table having data corresponding to different areas of the memory, the data representing cumulative erase operations which were performed on other areas of the memory, such that the areas of a memory device which may be susceptible to data loss can be identified the table data; and
   analyzing the data to identify areas of the memory device which may be susceptible to data loss.

23. A method of monitoring data storage in a non-volatile memory device, the method comprising the steps of:
   updating a first disturb count corresponding to a first memory location each time an erase operation is performed on a second memory location;
   updating a second disturb count corresponding to the second memory location each time an erase operation is performed on the first memory location;
   performing a data refresh operation on the first memory location when the first disturb count exceeds a predetermined value; and
   performing a data refresh operation on the second memory location when the second disturb count exceeds the predetermined value.

24. The method of claim 23 wherein the first and second disturb counts are reset after the execution of a data refresh operation on the corresponding memory location.

25. The method of claim 23 wherein the first and second disturb counts are reset after data stored in the corresponding memory locations are erased.

* * * * *

UNITED STATES PATENT AND TRADEMARK OFFICE
CERTIFICATE OF CORRECTION

PATENT NO. : 5,963,473
DATED : Oct. 5, 1999
INVENTOR(S) : Robert Norman

It is certified that error appears in the above-identified patent and that said Letters Patent is hereby corrected as shown below:

In column 20, line 19, delete "identified" and therefor insert --indentified in--.
In column 18, line 24, delete "plurality" and therefor insert --plurality of--.
In column 18, line 28, delete "plurality" and therefor insert --pluralirty of--.
In column 18, line 42, delete "a".

Signed and Sealed this

Thirtieth Day of January, 2001

Attest:

Q. TODD DICKINSON

*Attesting Officer*  *Director of Patents and Trademarks*